United States Patent
Joe et al.

(10) Patent No.: US 7,604,841 B2
(45) Date of Patent: Oct. 20, 2009

(54) METHOD FOR EXTENDING TIME BETWEEN CHAMBER CLEANING PROCESSES

(75) Inventors: Raymond Joe, Austin, TX (US); John Gumpher, McKinney, TX (US); Anthony Dip, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 908 days.

(21) Appl. No.: 10/814,713

(22) Filed: Mar. 31, 2004

(65) Prior Publication Data

US 2005/0221001 A1    Oct. 6, 2005

(51) Int. Cl.
C23C 16/30 (2006.01)
(52) U.S. Cl. .................. 427/255.31; 427/255.393; 427/255.394; 134/1.1
(58) Field of Classification Search ............ 427/255.31, 427/255.393, 255.394; 134/1.1
See application file for complete search history.

(56) References Cited

U.S. PATENT DOCUMENTS

| | | | | |
|---|---|---|---|---|
| 5,254,505 | A * | 10/1993 | Kamiyama | 438/785 |
| 5,824,375 | A * | 10/1998 | Gupta | 427/569 |
| 6,090,705 | A | 7/2000 | Arena et al. | 438/677 |
| 6,099,747 | A * | 8/2000 | Usami | 216/37 |
| 6,325,948 | B1 * | 12/2001 | Chen et al. | 216/67 |
| 6,338,874 | B1 * | 1/2002 | Law et al. | 427/255.18 |
| 6,413,321 | B1 | 7/2002 | Kim et al. | 118/725 |
| 6,426,015 | B1 * | 7/2002 | Xia et al. | 216/62 |
| 6,449,521 | B1 * | 9/2002 | Gupta | 700/121 |
| 6,589,868 | B2 * | 7/2003 | Rossman | 438/680 |
| 6,950,193 | B1 * | 9/2005 | Discenzo | 356/503 |
| 7,371,427 | B2 * | 5/2008 | Rajagopalan et al. | 427/237 |
| 2002/0058108 | A1 | 5/2002 | Bolscher et al. | 427/299 |
| 2002/0086118 | A1 | 7/2002 | Chang et al. | 427/447 |
| 2003/0211735 | A1 | 11/2003 | Rossman | 438/680 |

(Continued)

FOREIGN PATENT DOCUMENTS

EP    2003051452    2/2003

(Continued)

OTHER PUBLICATIONS

Taiwan Intellectual Property Office, Rejection Decision received in related Taiwanese Patent Application No. 94110235 dated Jul. 2008, 2 pp.

(Continued)

Primary Examiner—Bret Chen
(74) Attorney, Agent, or Firm—Wood, Herron & Evans, LLP (57) ABSTRACT

A method for extending time between chamber cleaning processes in a process chamber of a processing system. A particle-reducing film is formed on a chamber component in the process chamber to reduce particle formation in the process chamber during substrate processing, at least one substrate is introduced into the process chamber, a manufacturing process is performed in the process chamber, and the at least one substrate is removed from the process chamber. The particle-reducing film may be deposited on a clean chamber component or on a material deposit formed on a chamber component. Alternatively, the particle-reducing film may be formed by chemically modifying at least a portion of a material deposit on a chamber component. The particle-reducing film may be formed after each manufacturing process or at selected intervals after multiple manufacturing processes.

33 Claims, 8 Drawing Sheets

U.S. PATENT DOCUMENTS

2004/0132257 A1* 7/2004 Furuhashi et al. ........... 438/299
2006/0093756 A1* 5/2006 Rajagopalan et al. ....... 427/569

FOREIGN PATENT DOCUMENTS

EP          2003051533          2/2003
EP          2003100743          4/2003

OTHER PUBLICATIONS

Taiwan Intellectual Property Office, Notification of Rejection received in related Taiwanese Patent Application No. 9411025 dated Feb. 2008, 5 pp.

Taiwan Intellectual Property Office, Notification of Rejection received in related Taiwanese Patent Application No. 9411025 dated Dec. 2006, 3 pp.

* cited by examiner

METHOD FOR EXTENDING TIME BETWEEN CHAMBER CLEANING PROCESSES

FIELD OF THE INVENTION

The present invention relates to semiconductor processing, and more particularly, to a method for extending time between chamber cleaning processes by forming a particle-reducing film on chamber components in a process chamber.

BACKGROUND OF THE INVENTION

Many device manufacturing processes are performed in process chambers such as plasma etch chambers, plasma deposition chambers, thermal processing chambers, chemical vapor deposition chambers, atomic layer deposition chambers, etc. Processing of a substrate in a process chamber can lead to formation of material deposits on chamber components that are exposed to the process environment. The material deposits can be detrimental to device manufacturing and can require periodic wet or dry cleaning of the process chamber to remove the material deposits.

Chamber components are commonly replaced or cleaned after material deposits threaten particle problems, between incompatible processes to be run in sequence, and after detrimental processing conditions or poor processing results are observed. As device geometries have shrunk and tolerances on particle sizes and particle levels in process chambers and on processed substrates have been tightened, the frequency of chamber cleaning processes has increased, thereby lowering the throughput of the processing tool and increasing the cost of ownership.

Material deposits containing films with high film stress can require more frequent chamber cleaning in order to reduce particle levels in the process chamber. High film stress can promote film cracking when the total film thickness reaches a critical value and when the film undergoes thermal changes. Stress buildup can cause film flaking and breakup of the film into small particles that are transported throughout the process chamber. When particle detection techniques identify critical particle levels in a process chamber or on a processed substrate, a chamber cleaning process is used to restore proper manufacturing conditions.

Shrinking device geometries have also required a reduction in the thermal budget for various processing steps performed during device manufacturing. For example, thin silicon nitride (SiN) films that can be used as antireflective coatings (ARC), diffusion barriers, and protective cap layers have commonly been formed on a substrate in a low-pressure chemical vapor deposition (LPCVD) process by thermally reacting dichlorosilane (DCS, $SiH_2Cl_2$) and ammonia ($NH_3$) at a substrate temperature of about 750° C., or higher. High processing temperatures, however, can be detrimental to the device. The processing temperature for forming SiN films on a substrate can be lowered to about 550° C. by thermally cracking an organic precursor such as bis-tertiary-butylamino-silane (BTBAS, $SiH_2(NHBu^t)_2$,) in the presence of $NH_3$. However, the use of a BTBAS-based process instead of DCS and $NH_3$ can result in increased particle levels in the process chamber and on a processed substrate due to significantly higher film stress and reduced adhesion of the SiN films to the chamber components. Based on the total SiN film thickness on chamber components, the time between required chamber cleaning processes can be an order of magnitude shorter when using a BTBAS-based process compared to using DCS and $NH_3$.

SUMMARY OF THE INVENTION

The present invention provides a method for extending time between chamber cleaning processes. To this end, a processing system having a process chamber is provided, a particle-reducing film is formed on a chamber component in the process chamber to reduce particle formation in the process chamber during substrate processing, at least one substrate is introduced in the process chamber, a manufacturing process is performed in the process chamber, and the at least one substrate is removed from the process chamber.

In one embodiment of the invention, the particle-reducing film can be an oxide or oxynitride film formed on a clean chamber component. In another embodiment of the invention, the oxide or oxynitride particle-reducing film can be formed on a pre-existing material deposit residing on a chamber component. In yet another embodiment of the invention, the particle-reducing film can be formed by chemically modifying at least a portion of a pre-existing material deposit residing on a chamber component to convert the portion to an oxide, nitride or oxynitride. During the substrate processing, a new material deposit is formed on the particle-reducing film on the chamber component, and the presence of the particle-reducing film reduces particle formation from one or both of the pre-existing deposit or the new deposit.

The present invention further provides a computer readable medium executable by a processor to cause a processing system to perform the method.

DETAILED DESCRIPTION OF SEVERAL EMBODIMENTS

Figure 1A:
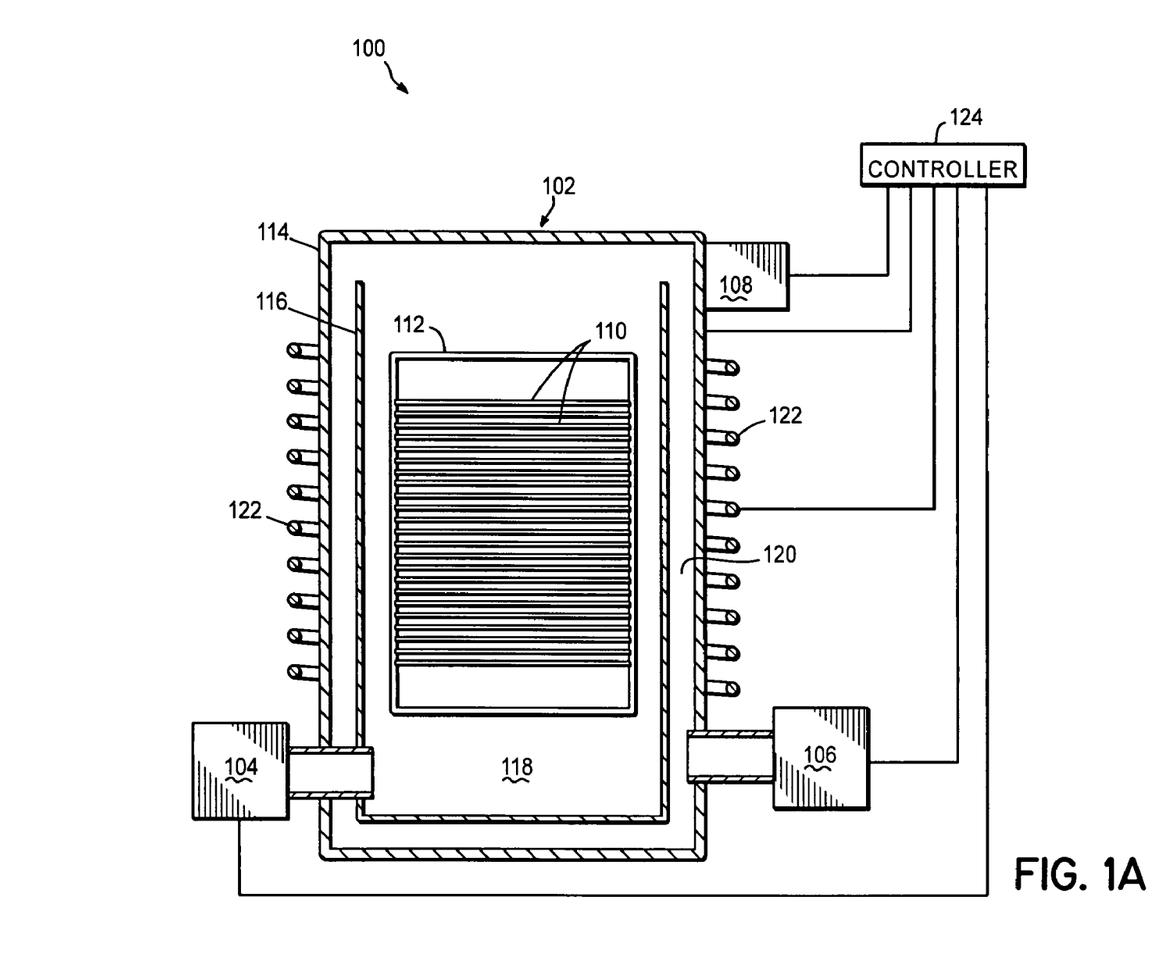
FIG. 1A shows a simplified block diagram of a batch-type processing system according to an embodiment of the invention.

FIG. 1A shows a simplified block diagram of a batch-type processing system according to an embodiment of the invention. The batch-type processing system 100 includes a process chamber 102, a gas injection system 104, a heater 122, a vacuum pumping system 106, a process monitoring system 108, and a controller 124. Multiple substrates 110 can be loaded into the process chamber 102 and processed using substrate holder 112. Furthermore, the process chamber 102 comprises an outer section 114 and an inner section 116. In one embodiment of the invention, the inner section 116 can be a process tube.

The gas injection system 104 can introduce gases into the process chamber 102 for purging the process chamber 102, and for preparing, cleaning, and processing the substrates 110. The gas injection system 104 can, for example, include a liquid delivery system (LDS) (not shown) that contains a vaporizer to vaporize a liquid. The vaporized liquid can be flowed into the process chamber 102 with or without the aid of a carrier gas. For example, when a carrier gas is used, the gas injection system 104 can include a bubbling system where the carrier gas is bubbled through a reservoir containing a liquid. In addition, the gas injection system 104 can be configured for flowing a gas, from a high-pressure container. Furthermore, the above-mentioned gas flows can, for example, contain an inert gas. A plurality of gas supply lines can be arranged to flow gases into the process chamber 102. The gases can be introduced into volume 118, defined by the inner section 116, and exposed to substrates 110. Thereafter, the gases can flow into the volume 120, defined by the inner section 116 and the outer section 114, and exhausted from the process chamber 102 by the vacuum pumping system 106.

Substrates 110 can be loaded into the process chamber 102 and processed using substrate holder 112. The batch-type processing system 100 can allow for a large number of tightly stacked substrates 110 to be processed, thereby resulting in high substrate throughput. A substrate batch size can, for example, be about 100 substrates (wafers), or less. Alternately, the batch size can be about 25 substrates, or less. The process chamber 102 can, for example, process a substrate of any size, for example 200 mm substrates, 300 mm substrates, or even larger substrates. The substrates 110 can, for example, comprise semiconductor substrates (e.g. silicon or compound semiconductor), LCD substrates, and glass substrates. In addition to clean substrates, substrates with dielectric films formed thereon can be utilized, including but not limited to, oxide films, nitride films, and oxynitride films.

The batch-type processing system 100 can be controlled by a controller 124 capable of generating control voltages sufficient to communicate and activate inputs of the batch-type processing system 100 as well as monitor outputs from the batch-type processing system 100. Moreover, the controller 124 can be coupled to and exchange information with process chamber 102, gas injection system 104, heater 122, process monitoring system 108, and vacuum pumping system 106. For example, a program stored in the memory of the controller 124 can be utilized to control the aforementioned components of the batch-type processing system 100 according to a stored process recipe. One example of controller 124 is a DELL PRECISION WORKSTATION 610™, available from Dell Corporation, Austin, Tex.

Real-time process monitoring can be carried out using process monitoring system 108. In general, the process monitoring system 108 is a versatile monitoring system and can, for example, include a mass spectrometer (MS) or a Fourier Transform Infra-red (FTIR) spectrometer. The process monitoring system 108 can provide qualitative and quantitative analysis of the gaseous chemical species in the process environment. Process parameters that can be monitored include gas flows, gas pressure, ratios of gaseous species, and gas purities. Alternately, the process monitoring system 108 can be a laser-based particle counter for determining particle levels in the process chamber 102.

Figure 1B:
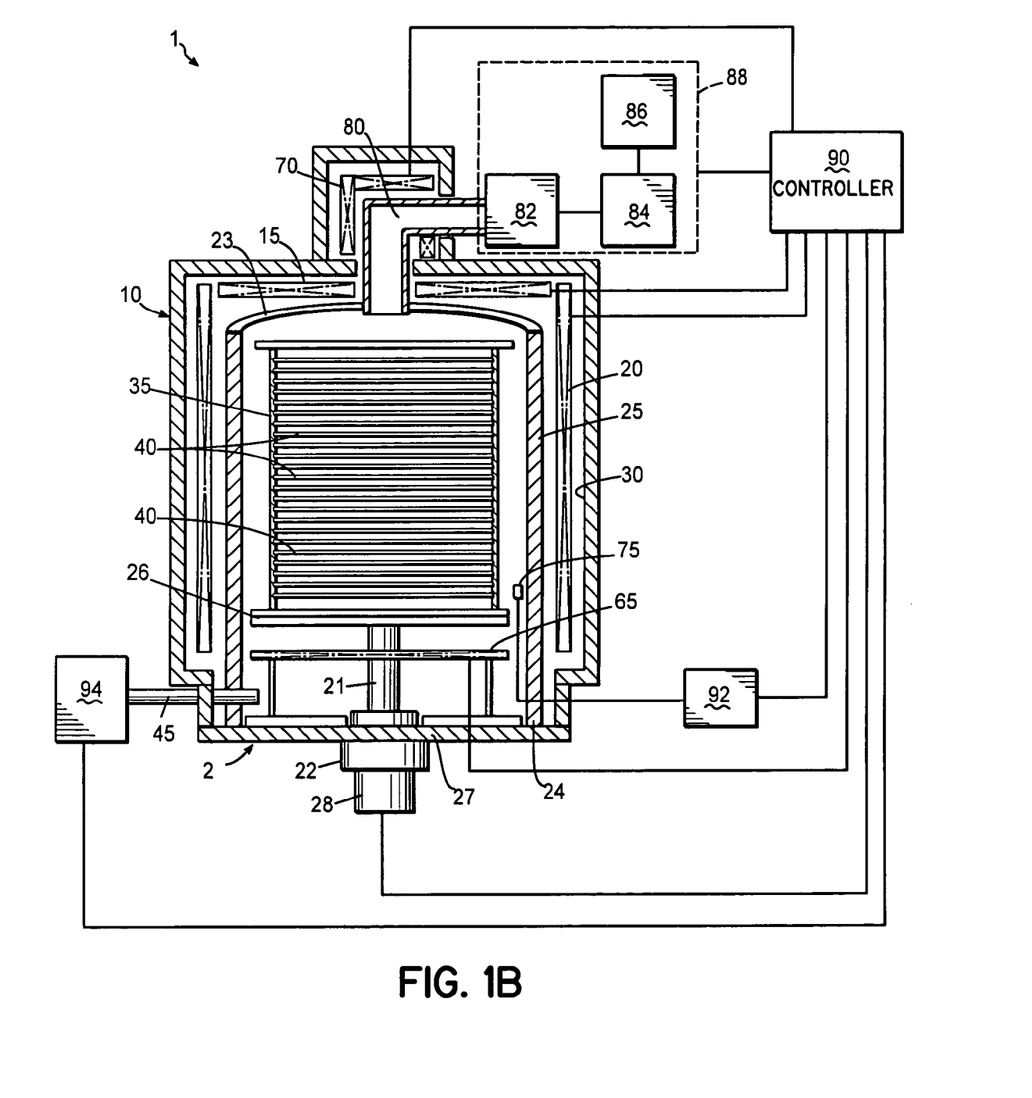
FIG. 1B shows a simplified block diagram of another batch-type processing system according to an embodiment of the invention.

FIG. 1B shows a simplified block diagram of another batch-type processing system according to an embodiment of the invention. The batch-type processing system 1 contains a process chamber 10 and a process tube 25 that has a upper end connected to an exhaust pipe 80, and a lower end hermetically joined to a lid 27 of cylindrical manifold 2. The exhaust pipe 80 discharges gases from the process tube 25 to a vacuum pumping system 88 to maintain a pre-determined atmospheric or below atmospheric pressure in the processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotating shaft 21 penetrating the lid 27 and driven by a motor 28. The turntable 26 can be rotated during processing to improve overall film uniformity or, alternately, the turntable can be stationary during processing. The lid 27 is mounted on an elevator 22 for transferring the substrate holder 35 in and out of the process tube 25. When the lid 27 is positioned at its uppermost position, the lid 27 is adapted to close the open end of the manifold 2.

A plurality of gas supply lines can be arranged around the manifold 2 to supply a plurality of gases into the process tube 25 through the gas supply lines. In FIG. 1B, only one gas supply line 45 among the plurality of gas supply lines is shown. The gas supply line 45 is connected to a gas injection system 94. A cylindrical heat reflector 30 is disposed so as to cover the reaction tube 25. The heat reflector 30 has a mirror-finished inner surface to suppress dissipation of radiation heat radiated by main heater 20, bottom heater 65, top heater 15, and exhaust pipe heater 70. A helical cooling water passage (not shown) is formed in the wall of the process chamber 10 as a cooling medium passage.

A vacuum pumping system 88 comprises a vacuum pump 86, a trap 84, and automatic pressure controller (APC) 82. The vacuum pump 86 can, for example, include a dry vacuum pump capable of a pumping speed up to 20,000 liters per second (and greater). During processing, gases can be introduced into the process chamber 10 via the gas injection system 94 and the process pressure can be adjusted by the APC 82. The trap 84 can collect unreacted precursor material and by-products from the process chamber 10.

The process monitoring system 92 comprises a sensor 75 capable of real-time process monitoring and can, for example, include a MS, a FTIR spectrometer, or a particle counter. A controller 90 includes a microprocessor, a memory, and a digital I/O port capable of generating control voltages sufficient to communicate and activate inputs to the processing system 1 as well as monitor outputs from the processing system 1. Moreover, the controller 90 is coupled to and can exchange information with gas injection system 94, motor 28, process monitoring system 92, heaters 20, 15, 65, and 70, and vacuum pumping system 88. As with the controller 124 of FIG. 1A, the controller 90 may be implemented as a DELL PRECISION WORKSTATION 610™.

Figure 2:
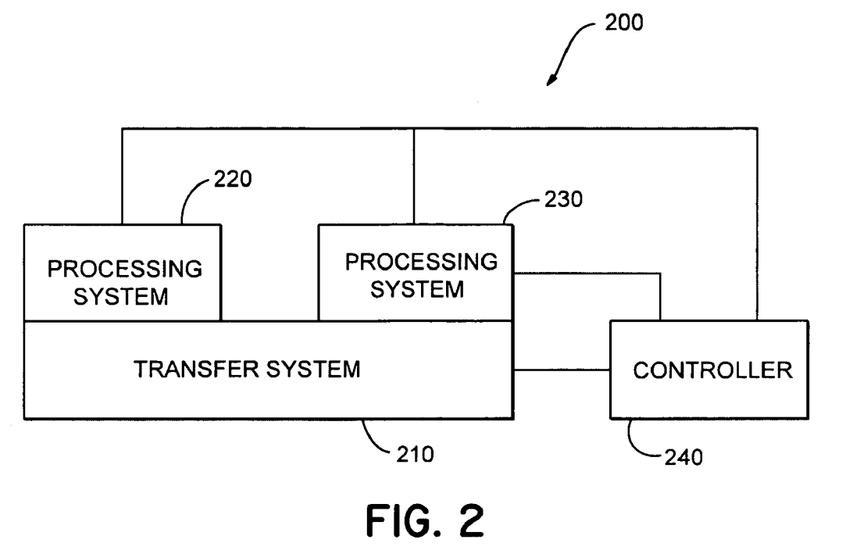
FIG. 2 shows a simplified block diagram of a processing tool according to an embodiment of the invention.

FIG. 2 shows a simplified block diagram of a processing tool according to an embodiment of the invention. The processing tool 200 comprises processing systems 220 and 230, a (robotic) transfer system 210 configured for transferring a substrate within the processing tool 200, and a controller 240 configured to control the components of the processing tool 200. In another embodiment of the invention, the processing tool 200 can comprise a single processing system or, alternately, can comprise more than two processing systems. In FIG. 2, the processing system 220 can, for example, be configured to process a substrate in a manufacturing process, and processing system 230 can, for example, be configured for measuring particle levels on a substrate. In one embodiment of the invention, the processing system 220 can include a batch-type processing system depicted in FIGS. 1A and 1B. Alternately, the processing system 220 can include a single wafer processing system. The processing system 220 can include a thermal processing system, a plasma processing system, or an atomic layer deposition system. The controller of any of FIGS. 1A-1B and 2 may be implemented as a general purpose computer system such as that described below with respect to FIG. 8.

Figure 3A:
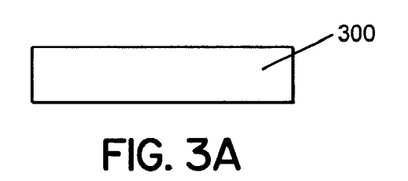
FIGS. 3A-3C schematically show a cross-sectional view of a chamber component during processing.
Figure 3B:
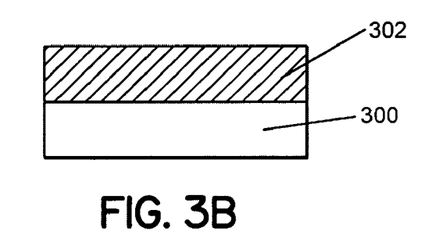
Figure 3C:
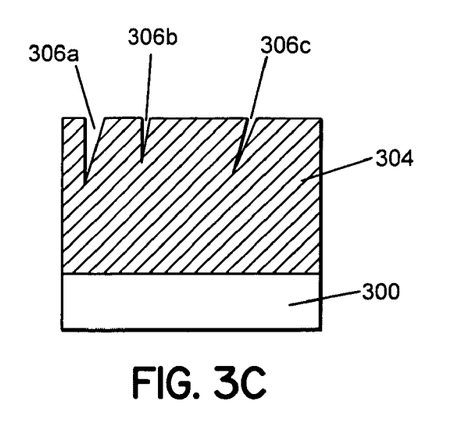

FIGS. 3A-3C schematically show cross-sectional view of a chamber component during processing. The chamber component 300 can, for example, be any component or surface of the processing systems in FIGS. 1A-1B that is exposed to the process environment in a process chamber. The chamber component 300 can, for example, be a process tube, a wall, a gas supply line, a manifold, or a substrate holder. The chamber component 300 can contain a variety of materials commonly used in processing systems, for example quartz ($SiO_2$), alumina ($Al_2O_3$), SiN, or silicon carbide (SiC). FIG. 3B shows a pre-existing material deposit 302 previously formed on the chamber component 300 during prior processing of a substrate in the process chamber. The processing can be a manufacturing process for forming a semiconductor device, such as an etching process where material is removed from a substrate or a deposition process where material is added to a substrate.

FIG. 3C shows a pre-existing material deposit 304 with a thickness that exceeds a critical thickness and results in formation of cracks 306a-306c in the material deposit 304. The presence of cracks 306a-306c can cause flaking of the material deposit 304 along with increased particle levels in the process chamber and on a processed substrate. When particle levels in the process chamber and/or on a processed substrate exceed a pre-determined level in manufacturing specifications, processing is interrupted and the material deposit 304 is removed from the chamber component 300 in a chamber cleaning process to restore proper manufacturing conditions.

Figure 4:
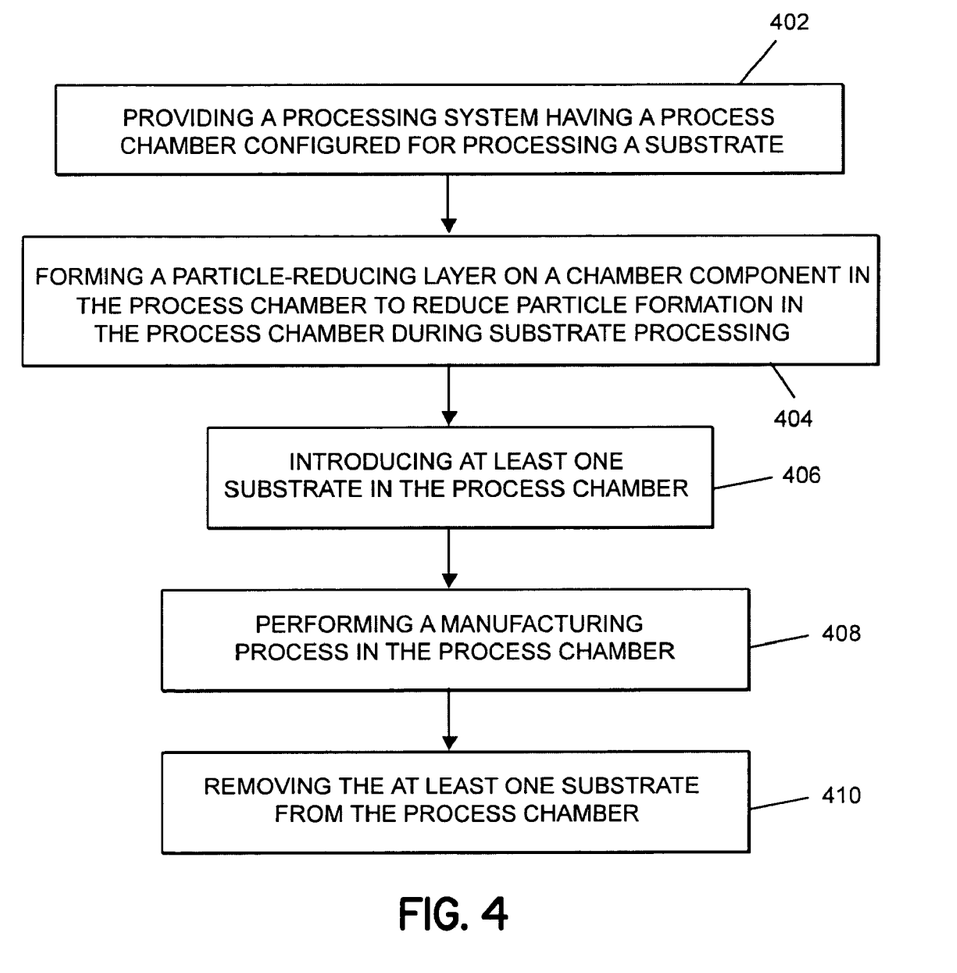
FIG. 4 is a flowchart for extending the time between chamber cleaning processes according to an embodiment of the invention.

FIG. 4 is a flowchart for extending time between chamber cleaning processes according to an embodiment of the invention. At 402, a processing system having a process chamber configured for processing a substrate is provided. The processing system may include a batch-type processing system depicted in FIGS. 1A and 1B, where one or more substrates can be processed at the same time or, alternately, the processing system may include a single wafer processing system, where a single substrate is processed at given time.

At 404, a particle-reducing film or layer is formed on a chamber component in the process chamber to reduce particle formation in the process chamber during substrate processing. The terms "film" and "layer" are used interchangeably herein and are intended to have the same meaning. The particle-reducing film can reduce particle formation by relieving film stress and improving adhesion of a material deposit to a chamber component. In one embodiment of the invention, the particle-reducing film may be formed on a clean surface of the chamber component. In another embodiment of the invention, the particle-reducing film may be formed on a pre-existing material deposit formed on a chamber component. The particle-reducing film formed on the clean surface or on the pre-existing deposit may be an oxide film or an oxynitride film, for example a silicon oxide film or a silicon oxynitride film. In yet another embodiment of the invention, the particle-reducing film may be formed from a pre-existing deposit by chemically modifying at least a portion of a material deposit previously formed on a chamber component. For example, the pre-existing deposit may be nitrided or oxidized or both. The particle-reducing film can be formed by exposing a chamber component to a reactant gas and the method may further include purging and evacuation steps to remove the reactive gas and particles from the process chamber. At 406, at least one substrate is introduced into the process chamber, and at 408, a manufacturing process is performed in the process chamber. At 410, the at least one substrate is removed from the process chamber.

Steps 406, 408, and 410 can be repeated until particle levels in the process chamber and/or on processed substrates are determined to exceed manufacturing specifications. Then the manufacturing is interrupted and a chamber cleaning process is performed to restore proper manufacturing conditions in the process chamber. According to the current invention, forming a particle-reducing layer on a chamber component in step 404, allows for increased repeating of steps 406, 408, and 410 before a cleaning process is required, thus increasing the throughput of the processing system.

Figure 5A:
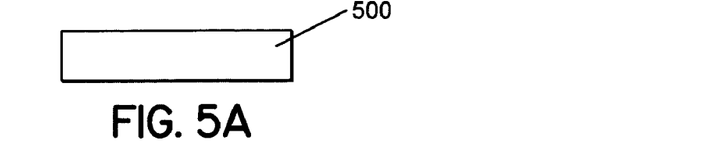
FIGS. 5A-5D schematically show a cross-sectional view of a chamber component according to an embodiment of the invention.
Figure 5B:
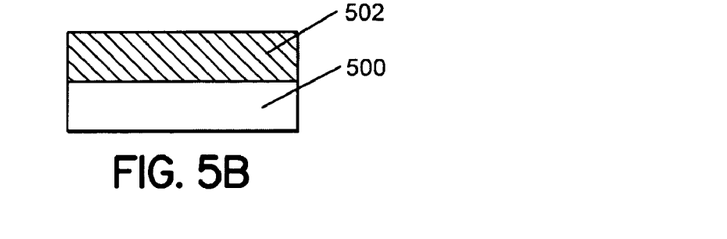

FIGS. 5A-5D schematically show a cross-sectional view of a chamber component according to an embodiment of the invention. FIG. 5A shows a clean chamber component 500. FIG. 5B shows a particle-reducing film 502 formed on the clean chamber component 500. The optimum type of particle-reducing film and the particle-reducing film thickness can be selected through experimentation so as to effectively reduce film stress in a new material deposit formed on the particle-reducing film during subsequent substrate processing, to maintain a stable deposition rate of the new material deposit on chamber components, and to decrease particle levels within the process chamber during subsequent substrate processing. While not intending to be bound by theory, it is believed that the new deposit will adhere more strongly to the particle-reducing film than to the clean component surface and that the interaction between the film and new deposit relieves stress in the new deposit such that thicker deposits can be formed before cracking and flaking occurs. The particle-reducing film selection can further include evaluating the cost of implementing and forming the particle-reducing film on a chamber component within the process chamber and also the impact on the tool cost of ownership. In one embodiment of the invention, the particle-reducing film 502 for a BTBAS-based silicon nitride manufacturing process can be an oxide film, e.g., silicon dioxide ($SiO_2$), with a thickness between about 1,000 angstroms (Å), or less, and about 3,000 Å, where the film thickness can be determined by experimentation.

Figure 5C:
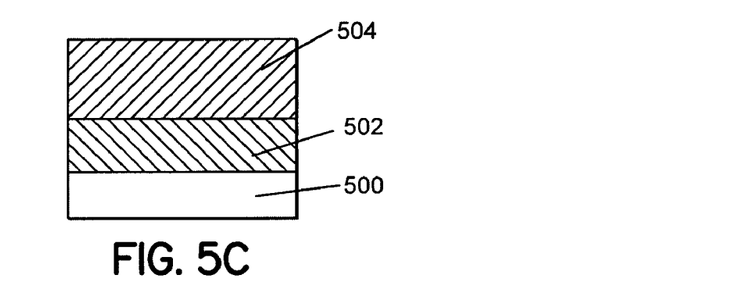
Figure 5D:
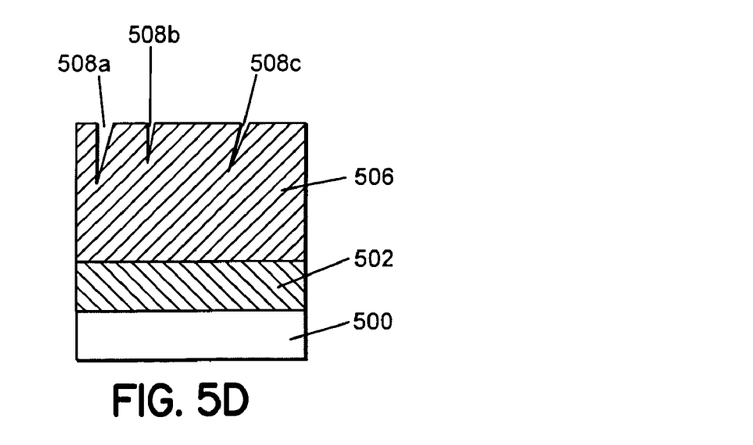

FIG. 5C shows a new material deposit 504 formed on the particle-reducing film 502. The new material deposit 504 can be formed in single manufacturing process performed in a process chamber or, alternately, the material deposit 504 can be formed in multiple manufacturing processes. For example, in a SiN process, the new deposit 504 will include SiN. FIG. 5D shows a new material deposit 506 with a thickness that exceeds a critical thickness that results in formation of cracks 506a-506c in the film 506. The critical thickness of the material deposit 506 that is formed on the particle-reducing film 502 is greater than the critical thickness of film 304 in FIG. 3B that is formed on chamber component 300. Thus, the use of the particle-reducing film 502 allows for extending time between chamber cleaning processes, which results in increased throughput of the processing tool.

In one embodiment of the invention, a $SiO_2$ particle-reducing film may be utilized for reducing film stress in a SiN material deposit formed on a chamber component by a BTBAS-based LPCVD process. The current inventors have used a batch-type processing system configured for processing multiple 300 mm substrates (wafers) to show that a $SiO_2$ film formed on a chamber component can effectively reduce film stress in a SiN material deposit formed on the $SiO_2$ film and thereby reduce particle formation in the process chamber and extend the time between chamber cleaning processes. In view of particle levels in the process chamber environment, on processed substrates, and processing tool specifications, the average time between chamber cleaning processes was as least three times longer when a $SiO_2$ film was formed on chamber components prior to performing a SiN manufacturing process in the process chamber.

In one embodiment of the invention, a $SiO_2$ film may be formed on the inner surfaces of a quartz process tube of batch-type processing system, e.g., process tube 25 depicted in FIG. 1B. The $SiO_2$ film may be formed by exposing the process tube 25 to a silicon-containing reaction gas, e.g., silane ($SiH_4$), disilane ($Si_2H_6$), hexachlorodisilane ($Si_2Cl_6$), dichlorosilane ($SiH_2Cl_2$), trichlorosilane ($SiHCl_3$), monochlorosilane ($SiH_3Cl$), or $SiH_2(NHBu^t)_2$, and an oxygen-containing gas such as $O_2$, $O_3$, NO, $NO_2$, or $N_2O$. Alternately, a $SiO_2$ film may be formed using a reaction gas containing tetra-ethoxy silane ($Si(OC_2H_5)_4$) with or without the use of the use of the abovementioned oxygen-containing gases. The pressure in the process chamber during formation of the $SiO_2$ film can be less than about 100 Torr, or less than about 1 Torr. Following formation of a $SiO_2$ film on the inner surfaces of the process tube 25, the process chamber may be further prepared for processing a substrate in a manufacturing process using purging and evacuating steps. The purging steps can, for example, include flowing an inert gas, e.g., nitrogen ($N_2$) or argon (Ar), in the process chamber.

Figure 6A:
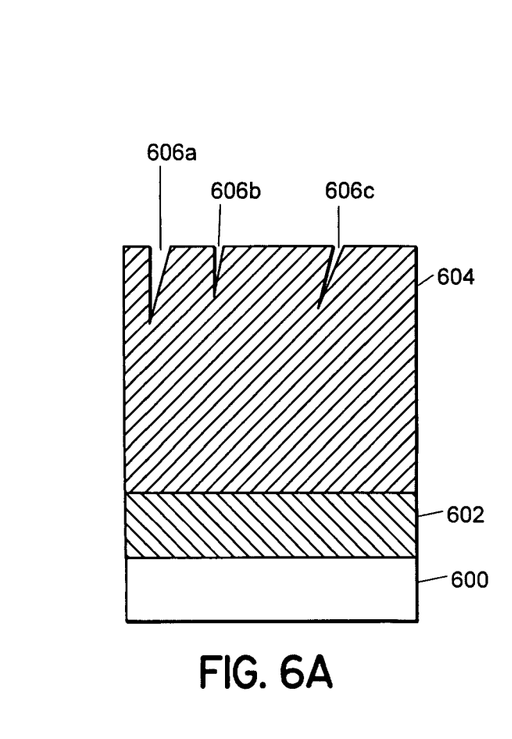
FIGS. 6A-6C schematically show a cross-sectional view of a chamber component according to another embodiment of the invention.
Figure 6B:
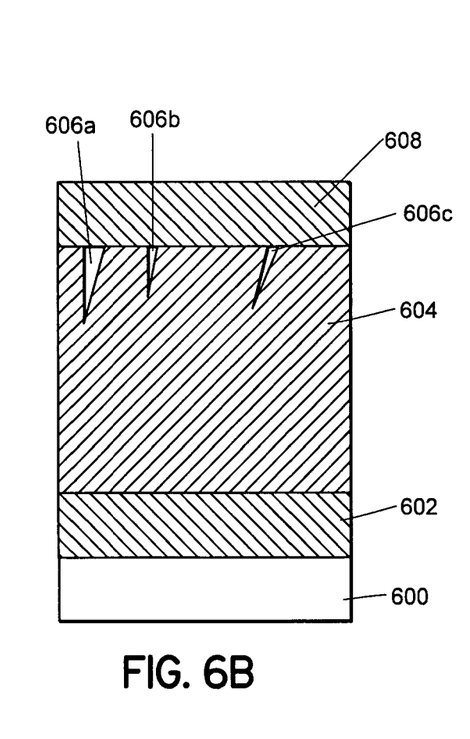
Figure 6C:
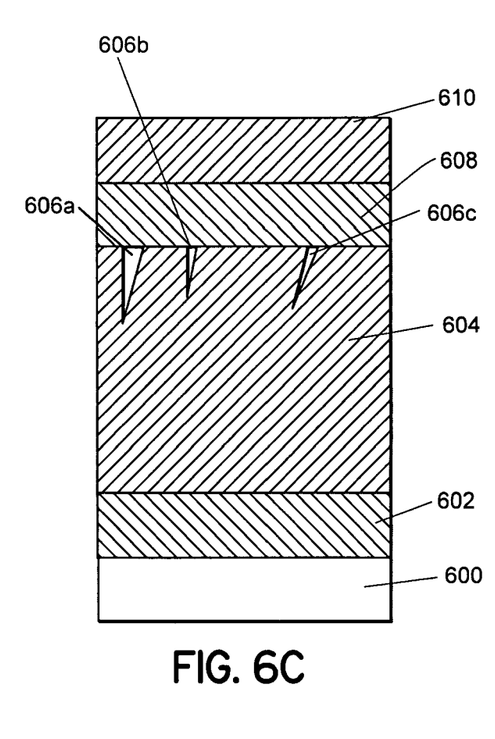

FIGS. 6A-6C schematically show a cross-sectional view of a chamber component according to an embodiment of the invention. FIG. 6A shows a new material deposit 604 that is formed on a particle-reducing film 602 formed on chamber component 600. FIG. 6B shows a second particle-reducing film 608 that is formed on the material deposit 604 to relieve film stress and seal cracks 606a-606c in the material deposit 604. Alternately, the second particle-reducing film 608 may be formed before the material deposit 604 reaches a critical thickness and cracks 606a-606c are formed. Following formation of the second particle-reducing film 608, substrate processing may be continued in the process chamber without performing a chamber cleaning process. FIG. 6C shows a second new material deposit 610 formed on the second particle-reducing layer 608 after further substrate processing. The second particle-reducing film 608 reduces particle formation from the underlying material deposit 604 and from the second new material deposit 610. A particle-reducing film may be formed on a chamber component after each manufacturing process or, alternately, at selected intervals after multiple manufacturing processes.

Figure 7A:
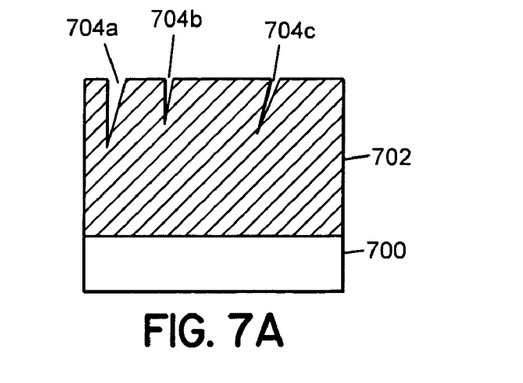
FIGS. 7A-7C schematically show a cross-sectional view of a chamber component according to yet another embodiment of the invention.
Figure 7B:
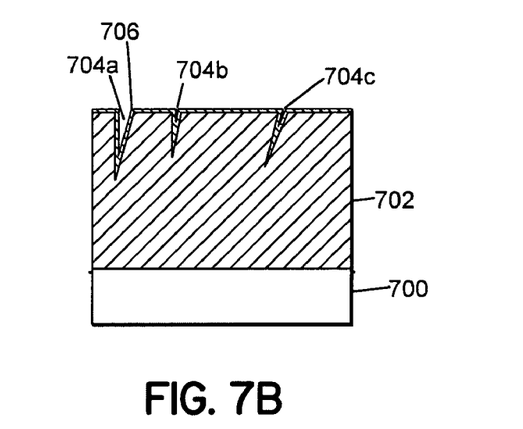

FIGS. 7A-7C schematically show a cross-sectional view of a chamber component according to an embodiment of the invention. FIG. 7A shows a pre-existing material deposit 702 previously formed on a chamber component 700. FIG. 7B shows a particle-reducing film 706 that is formed by chemically modifying at least a portion of the material deposit 702. The particle-reducing film 706 can, for example, have higher nitrogen content, oxygen content, or both, and may be formed by exposing the material deposit 702 to a reactant gas containing at least one of $H_2O$, $O_2$, $O_3$, $N_2$, NO, $N_2O$, $NO_2$, and $NH_3$. The pressure in the process chamber during formation of the particle-reducing film can, for example, be between about 10 mTorr and about 100 Torr.

Alternately, the particle-reducing film 706 may be formed before the material deposit 704 reaches a critical thickness and cracks 704a-704c are formed. The particle-reducing film 706 may be formed after each manufacturing process or, alternately, at certain intervals between multiple manufacturing processes.

Figure 7C:
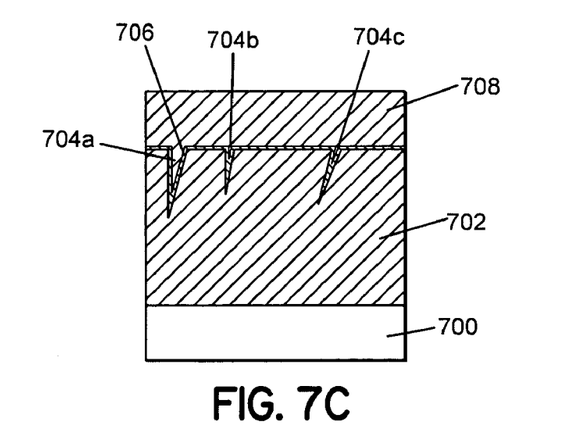

In one example, the particle-reducing film 706 may be formed by exposing a SiN material deposit 702 to a reactive gas containing $NH_3$. The particle-reducing film 706 is formed through chemical modification of the SiN material deposit 702 by increasing its nitrogen content. The current inventors have discovered that chemically modifying a SiN material deposit can reduce the SiN film stress and extend the time between chamber cleaning processes. FIG. 7C shows a new material deposit 708 formed on the particle-reducing film 706 after further substrate processing.

The formation of a particle-reducing layer may include elevating the temperature of a chamber component in a process chamber from a first temperature to a second temperature and exposing the chamber component at least once to a reaction gas at the second temperature. The reactant gas exposure can be combined with purging and evacuation steps. The first temperature can, for example, be the temperature of the chamber component when a substrate is subjected to a manufacturing process in the process chamber. For example, the first temperature may between about 400° C. and about 800° C., and may be elevated to a second temperature that is between about 100° C. and about 300° C., or more, above the first temperature. Elevating to the second temperature may reduce the film stress of material deposit on a chamber component by outgassing of impurities such as hydrogen from the material deposit. In addition, the temperature of the chamber component can be varied during purging and evacuation steps following formation of the particle-reducing layer on the chamber component. Following the formation of a particle-reducing layer at the second temperature, the temperature of the chamber component may be lowered back to the first temperature under an inert gas purge.

Alternately, following the formation of a particle-reducing layer on a chamber component at the second temperature, the temperature of the chamber component may be lowered to below the first temperature during purging and evacuation, and the temperature of the chamber component subsequently elevated to the first temperature. Lowering the temperature of the chamber component below the first temperature may increase flaking of any loosely adhered material deposit from a chamber component prior to processing a substrate in the process chamber.

In the preceding description, material deposits containing SiN films with high film stress were used to demonstrate several embodiments of the invention. It is to be understood that the current invention is not limited to material deposits containing SiN films, but can also be applied to a variety of other types of material deposits encountered in manufacturing of semiconductor devices. Furthermore, in addition to a batch-type processing system, the current invention can be practiced in a single substrate processing system.

Figure 8:
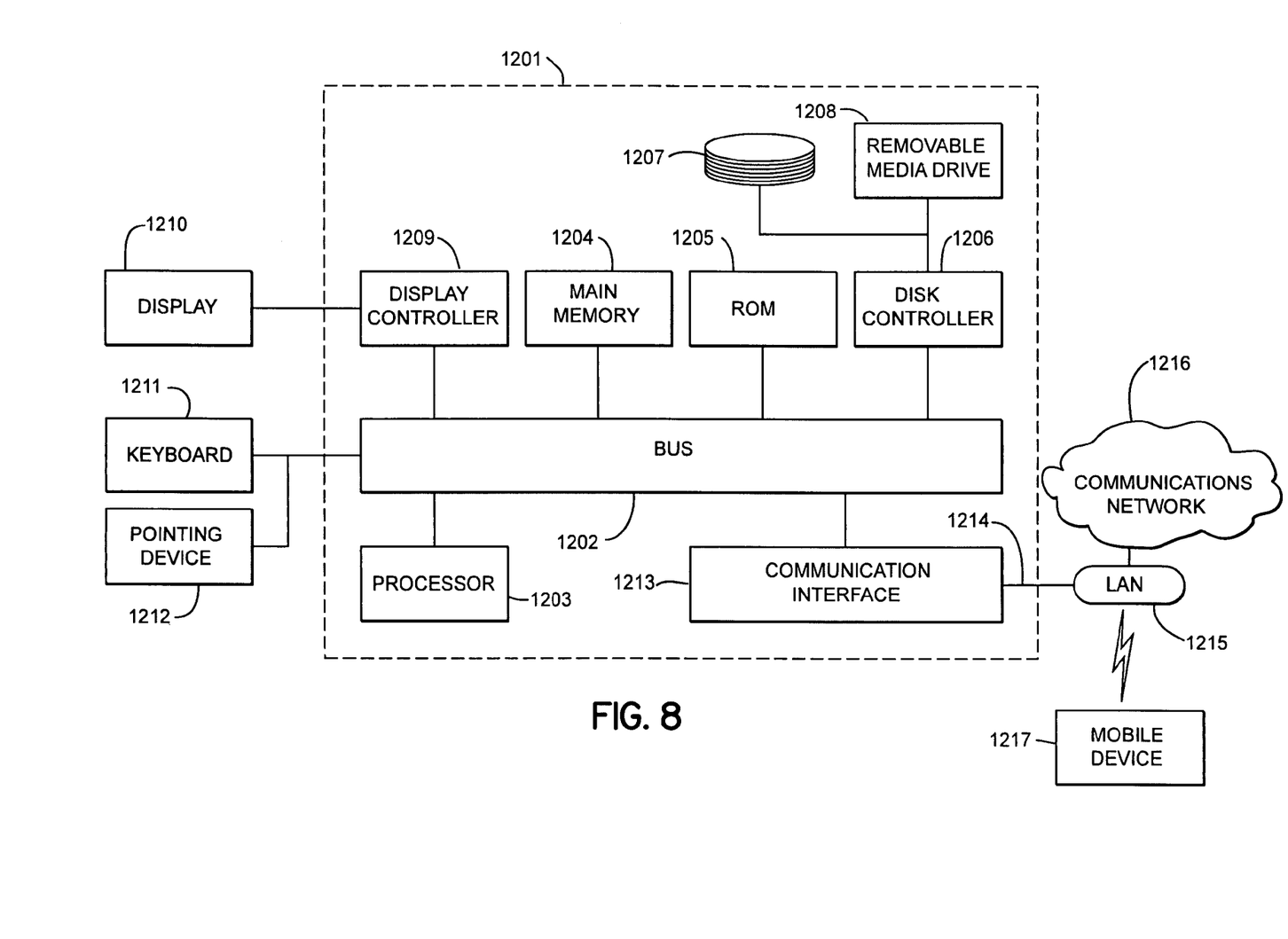
FIG. 8 shows a general purpose computer which may be used to implement the present invention.

FIG. 8 illustrates a computer system 1201 with which an embodiment of the present invention may be implemented. The computer system 1201 may be used as the controller 124, 90, 240 of FIG. 1A, 1B, or 2, respectively, or a similar controller that may be used with the systems of these figures to perform any or all of the functions described above. The computer system 1201 includes a bus 1202 or other communication mechanism for communicating information, and a processor 1203 coupled with the bus 1202 for processing the information. The computer system 1201 also includes a main memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by processor 1203. In addition, the main memory 1204 may be used for storing temporary variables or other intermediate information during the execution of instructions by the processor 1203. The computer system 1201 further includes a read only memory (ROM) 1205 or other static storage device (e.g., programmable ROM (PROM), erasable PROM (EPROM), and electrically erasable PROM (EEPROM)) coupled to the bus 1202 for storing static information and instructions for the processor 1203.

The computer system 1201 also includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs), (not shown). The computer system may also include one or more digital signal processors (DSPs) (not shown), such as the TMS320 series of chips from Texas Instruments, the DSP56000, DSP56100, DSP56300, DSP56600, and DSP96000 series of chips from Motorola, the DSP1600 and DSP3200 series from Lucent Technologies or the ADSP2100 and ADSP21000 series from Analog Devices. Other processors especially designed to process analog signals that have been converted to the digital domain may also be used.

The computer system 1201 may also include a display controller 1209 coupled to the bus 1202 to control a display 1210, such as a cathode ray tube (CRT), for displaying information to a computer user. The computer system includes input devices, such as a keyboard 1211 and a pointing device 1212, for interacting with a computer user and providing information to the processor 1203. The pointing device 1212, for example, may be a mouse, a trackball, or a pointing stick for communicating direction information and command selections to the processor 1203 and for controlling cursor movement on the display 1210. In addition, a printer (not shown) may provide printed listings of data stored and/or generated by the computer system 1201.

The computer system 1201 performs a portion or all of the processing steps of the invention in response to the processor 1203 executing one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the computer system 1201, for driving a device or devices for implementing the invention, and for enabling the computer system 1201 to interact with a human user (e.g., print production personnel). Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor 1203 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to the computer system 1201 may receive the data on the telephone line and use an infrared transmitter to convert the data to an infrared signal. An infrared detector coupled to the bus 1202 can receive the data carried in the infrared signal and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical film (e.g., CAT 5 cable, coaxial cable, optical fiber, etc). The signals through the various networks and the signals on the network link 1214 and through the communication interface 1213, which carry the digital data to and from the computer system 1201 may be implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214, and the communication interface 1213. Moreover, the network link 1214 may provide a connection through a LAN 1215 to a mobile device 1217 such as a personal digital assistant (PDA) laptop computer or cellular telephone.

The computer system 1201 may be configured to perform the method of the present invention to extend time between chamber cleaning processes and processing a substrate. In accordance with the present invention, the computer system 1201 may be configured to provide a particle-reducing layer on a chamber component, wherein the particle-reducing layer reduces particle formation in a process chamber. The computer system 1201 may be further configured to control a processing tool for processing a substrate.

Although only certain embodiments of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

What is claimed is:

1. A method of decreasing the frequency of chamber cleaning processes for a process chamber of a processing system, the method comprising:

introducing one or more first substrates into the process chamber;

performing a first manufacturing process on the one or more first substrates in the process chamber whereby a first film deposit is formed on a chamber component in the process chamber;

removing the one or more first substrates from the process chamber;

exposing the chamber component in the process chamber to a reactant gas to form a particle-reducing film, wherein the particle-reducing film is:

an oxide or oxynitride film formed on the first film deposit residing on the chamber component, or a nitride, oxide or oxynitride film formed from at least a portion of the first film deposit residing on the chamber component;

introducing one or more second substrates into the process chamber;

performing a second manufacturing process on the one or more second substrates in the process chamber whereby a new film deposit is formed on the particle-reducing film, and wherein the particle-reducing film reduces particle formation in the process chamber during processing of the one or more second substrates from one or both of the first film deposit or the new film deposit; and removing the one or more second substrates from the process chamber.

2. The method according to claim 1, wherein the chamber component is a process tube, a wall, a gas supply line, a manifold, or a substrate holder or a combination of two or more thereof.

3. The method according to claim 1, wherein the particle-reducing film is an oxide film.

4. The method according to claim 1, wherein the particle-reducing film is a $SiO_2$ film.

5. The method according to claim 4, wherein the $SiO_2$ film is deposited by exposing the chamber component to an oxygen-containing gas and a silicon-containing gas.

6. The method according to claim 5, wherein the oxygen-containing gas includes at least one gas selected from the group consisting of $O_2$, $O_3$, NO, $N_2O$, and $NO_2$, and the silicon-containing gas includes at least one gas selected from the group consisting of $SiH_4$, $Si_2H_6$, $Si_2Cl_6$, $SiH_2Cl_2$, $SiHCl_3$, $SiH_3Cl$, $SiH_2(NHBu^t)_2$, and $Si(OC_2H_5)_4$.

7. The method of claim 5, wherein the performing the second manufacturing process comprises performing a SiN manufacturing process in the process chamber whereby the new film deposit is a SiN deposit formed on the $SiO_2$ film, and wherein the $SiO_2$ film reduces particle formation in the process chamber during substrate processing from one or both of the first film deposit or the SiN deposit.

8. The method according to claim 7, wherein the SiN manufacturing process includes exposing the one or more second substrates to an organic silane-based precursor and a nitrogen-containing gas to deposit SiN on the one or more second substrates.

9. The method according to claim 7, wherein the SiN manufacturing process includes exposing the one or more second substrates to a bis-tertiary-butylamino-silane precursor in the presence of ammonia gas to deposit SiN on the one or more second substrates.

10. The method according to claim 4, wherein the $SiO_2$ film is deposited by exposing the chamber component to a gas comprising $Si(OC_2H_5)_4$.

11. The method according to claim 1, wherein the reactant gas includes at least one gas selected from the group consisting of $H_2O$, $O_2$, $O_3$, $N_2$, NO, $N_2O$, $NO_2$ and $NH_3$ to form the nitride, oxide, or oxynitride film from at least a portion of the first film deposit by chemically modifying and lowering the film stress of the first film deposit.

12. The method of claims 11, wherein the performing the second manufacturing process comprises performing a SiN manufacturing process in the process chamber whereby the new film deposit is a SiN deposit formed on the particle-reducing film.

13. The method according to claim 12, wherein the SiN manufacturing process includes exposing the one or more second substrates to an organic silane-based precursor and a nitrogen-containing gas to deposit SiN on the one or more second substrates.

14. The method according to claim 12, wherein the SiN manufacturing process includes exposing the one or more second substrates to a bis-tertiary-butylamino-silane precursor in the presence of ammonia gas to deposit SiN on the one or more second substrates.

15. The method according to claim 1, further comprising:
elevating the temperature of the chamber component from a first temperature to a second temperature and exposing the chamber component to the reactant gas at the second temperature; and
returning the temperature of the chamber component to the first temperature prior to introducing the one or more second substrates.

16. The method according to claim 15, wherein the exposing is performed at a process chamber pressure between about 10 mTorr and about 100 Torr.

17. The method according to claim 15, wherein the exposing further comprises purging and evacuating the process chamber prior to introducing the one or more second substrates.

18. The method according to claim 17, wherein the exposing, purging, and evacuating are repeated at least once.

19. The method according to claim 15, wherein the first temperature is between about 400° C. and about 800° C.

20. The method according to claim 15, wherein the second temperature is between about 100° C. and about 300° C. greater than the first temperature.

21. The method according to claim 15, further comprising lowering the temperature of the chamber component from the second temperature to below the first temperature prior to returning the temperature of the chamber component to the first temperature.

22. The method according to claim 1, wherein the performing the first and second manufacturing processes comprise performing a SiN manufacturing process, and wherein the first film deposit and the new film deposit are SiN.

23. The method according to claim 1, wherein the performing the first and second manufacturing processes further comprise providing a process chamber pressure less than about 100 Torr.

24. The method according to claim 1, wherein the performing the first and second manufacturing processes further comprise providing a process chamber pressure less than about 1 Torr.

25. The method according to claim 1, further comprising repeating the sequence of exposing, introducing the one or more second substrates, performing the second manufacturing process, and removing the one or more second substrates at least once.

26. The method according to claim 1, further comprising repeating the sequence of introducing the one or more second substrates, performing the second manufacturing process, and removing the one or more second substrates at least once and until particle levels in the process chamber exceed a pre-determined level.

27. A method of decreasing the frequency of chamber cleaning processes for a process chamber of a processing system, the method comprising:
introducing one or more first substrates into the process chamber and heating a chamber component in the process chamber to a first temperature;
performing a first manufacturing process on the one or more first substrates in the process chamber at the first temperature whereby a first film deposit is formed on the chamber component in the process chamber;
removing the one or more first substrates from the process chamber;
elevating the temperature of the chamber component in the process chamber to a second temperature greater than the first temperature;
exposing the first film deposit on the chamber component in the process chamber to a reactant gas at the second temperature, wherein the reactant gas contains at least one of $H_2O$, $O_2$, $O_3$, $N_2$, NO, $N_2O$, $NO_2$, and $NH_3$ to chemically modify at least a portion of the first film deposit to thereby form a nitride, oxide or oxynitride particle-reducing film on the chamber component;
lowering the chamber component in the process chamber to the first temperature;
introducing one or more second substrates into the process chamber;
performing a second manufacturing process on the one or more second substrates in the process chamber at the first temperature whereby a new film deposit is formed on the particle-reducing film, and wherein the particle-reducing film reduces particle formation in the process chamber during processing of the one or more second substrates from one or both of the first film deposit or the new film deposit; and
removing the one or more second substrates from the process chamber.

28. The method according to claim 27, wherein the chamber component is a process tube, a wall, a gas supply line, a manifold, or a substrate holder or a combination of two or more thereof.

29. The method according to claim 27, wherein the first temperature is between about 400° C. and about 800° C.

30. The method according to claim 27, wherein the second temperature is between about 100° C. and about 300° C. greater than the first temperature.

31. The method according to claim 27, wherein lowering the chamber component to the first temperature includes lowering the chamber component from the second temperature to a third temperature below the first temperature and then returning the temperature of the chamber component to the first temperature.

32. The method according to claim 27, wherein the performing the first and second manufacturing processes comprises performing a SiN manufacturing process, and wherein the first film deposit and the new film deposit is SiN.

33. The method according to claim 27, further comprising repeating the introducing the one or more second substrates, performing the second manufacturing process, and removing the one or more second substrates at least once and until particle levels in the process chamber exceed a pre-determined level.

* * * * *

UNITED STATES PATENT AND TRADEMARK OFFICE
CERTIFICATE OF CORRECTION

PATENT NO. : 7,604,841 B2 Page 1 of 1
APPLICATION NO. : 10/814713
DATED : October 20, 2009
INVENTOR(S) : Raymond Joe et al.

It is certified that error appears in the above-identified patent and that said Letters Patent is hereby corrected as shown below:

In Column 4, line 2, "that has a upper end" should read --that has an upper end--.

In Column 7, line 21, "use of the use of the" should read --use of the--.

In Column 8, line 23, "temperature may between" should read --temperature may be between--.

In Column 9, line 27, "(FPGAs)," should read --(FPGAs)),--.

In Column 10, line 38, "media also may also" should read --media also may--.

In Column 11, line 19, "optical fiber, etc)." should read --optical fiber, etc.).--.

In Claim 12, Column 13, line 3, "method of claims 11," should read --method of claim 11,--.

In Claim 32, Column 14, line 58, "new film deposit is" should read --new film deposit are--.

Signed and Sealed this

Twenty-third Day of March, 2010

David J. Kappos
*Director of the United States Patent and Trademark Office*

UNITED STATES PATENT AND TRADEMARK OFFICE
CERTIFICATE OF CORRECTION

PATENT NO. : 7,604,841 B2  Page 1 of 1
APPLICATION NO. : 10/814713
DATED : October 20, 2009
INVENTOR(S) : Joe et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1487 days.

Signed and Sealed this

Fifth Day of October, 2010

David J. Kappos
*Director of the United States Patent and Trademark Office*